United States Patent [19]

Hollaway

[11] Patent Number: 4,480,197

[45] Date of Patent: Oct. 30, 1984

[54] MULTIPLE LOAD SWITCHING CIRCUIT

[76] Inventor: Jerrell P. Hollaway, 1330 Meadowbrook Rd. NE., Palm Bay, Fla. 32905

[21] Appl. No.: 274,283

[22] Filed: Jun. 16, 1981

Related U.S. Application Data

[63] Continuation-in-part of Ser. No. 160,444, Jun. 17, 1980, abandoned.

[51] Int. Cl.³ .................. H03K 17/72; H03K 17/94
[52] U.S. Cl. ..................... 307/252 N; 307/12; 307/140; 307/155; 307/252 Q; 307/39
[58] Field of Search ............ 307/12, 31, 38, 41, 307/125, 132 R, 140, 155, 252 N, 252 K, 252 Q, 305

[56] References Cited

U.S. PATENT DOCUMENTS 3,723,827  3/1973  Griswold et al. .................. 307/41
4,322,632  3/1982  Hart et al. ........................ 307/41

Primary Examiner—John Zazworsky

[57] ABSTRACT

The specification discloses an electronic circuit which allows selective energization of electrical loads from a remote location by successive momentary interruptions of a common power source.

In one embodiment, a ceiling fan and an attached light fixture are controlled from a single wall switch position, such that the first application of power energizes only the light circuit, a second application (following a momentary interruption) energizes only the fan circuit, and a third such application energizes both circuits at the same time.

14 Claims, 2 Drawing Figures

MULTIPLE LOAD SWITCHING CIRCUIT

CROSS-REFERENCES TO RELATED APPLICATIONS

This application is a continuation-in-part of U.S. application Ser. No. 160,444 entitled "Bistable Thyristor Switching Circuit" by Jerrell P. Hollaway, filed June 17, 1980, now abandoned.

BACKGROUND OF THE INVENTION

This invention relates to switching circuits which employ a thyristor as the main switching element.

In the past, when two or more electrical loads were to be operated from a common source of electrical power it was necessary to provide a separate control wire for each load when the loads were to be energized individually, since a common switching point between the source and the loads would be useful only for energizing all of the loads at the same time. Many applications exist, however, for a method of individually controlling multiple loads that share a common power source from a common switching point. For example, it would be very convenient to be able to individually control a ceiling fan and an attached light fixture from a single wall switch in a room.

Accordingly, a primary object of this invention is to provide a method of energizing individual loads, or groups of loads, when the loads are connected to a common power supply, without having to provide a separate control line to each load.

Another object of the invention is to perform all switching functions without modifications to existing wiring, switches, loads or sources.

Still another object of the invention is to avoid the use of mechanical or electromechanical devices, such as relays, in the design.

A further object is to perform the necessary functions without digital logic circuits and attendant power supplies, thereby keeping the invention simple and inexpensive.

Other objects and advantages of the present invention will be obvious from the detailed descriptions and drawings presented herein.

SUMMARY OF THE INVENTION

The stated objects are realized by the present invention, which includes individual bistable thyristor switching circuits connected between each load and the common power source, where each such circuit has a designated triggering scheme so that its load will be energized only at designated points in a sequence of momentary power interruptions.

DESCRIPTION OF THE PREFERRED EMBODIMENTS

A principle element in each of the preferred embodiments is a bistable thyristor switching circuit. This circuit is a unique arrangement of a thyristor, a capacitor memory and a trigger circuit that includes a zener diode.

This switching circuit takes advantage of a characteristic feature found in members of the thyristor family, that is, a thyristor can be made conductive between its main terminals by application of a control signal on its gate terminal and will remain conductive even after the control signal is removed as long as a minimum holdup current is allowed to flow between its main terminals. Devices that have this characteristic are said to have regenerative feedback.

Each bistable thyristor switching circuit uses a capacitor memory means for storing information representative of the most recent state of conduction. The presence or absence of voltage charge across the capacitor provides information concerning the previous operating state of the circuit or, in some applications, the length of time since the previous operating state existed.

A zener diode is used in the trigger circuit of each bistable thyristor switching circuit as a voltage regulator means. The purpose of this regulator is to deliver gate current to the thyristor on occasions when circuit operating conditions present a voltage to the regulator that exceeds the reference level of the regulator, and is its zener value. To distinguish this type of trigger circuit over other types, this circuit is referred to as a voltage regulator trigger means.

In discussing the detailed operation of the preferred embodiments, it will be necessary to consider relative time differences in power interruptions. For purposes of discussion, a "brief interruption" is defined to last $\frac{1}{2}$-2 seconds, a "pause" is defined to last 2-5 seconds, and a "rest period" is defined to last 5 seconds or more.

Figure 1:
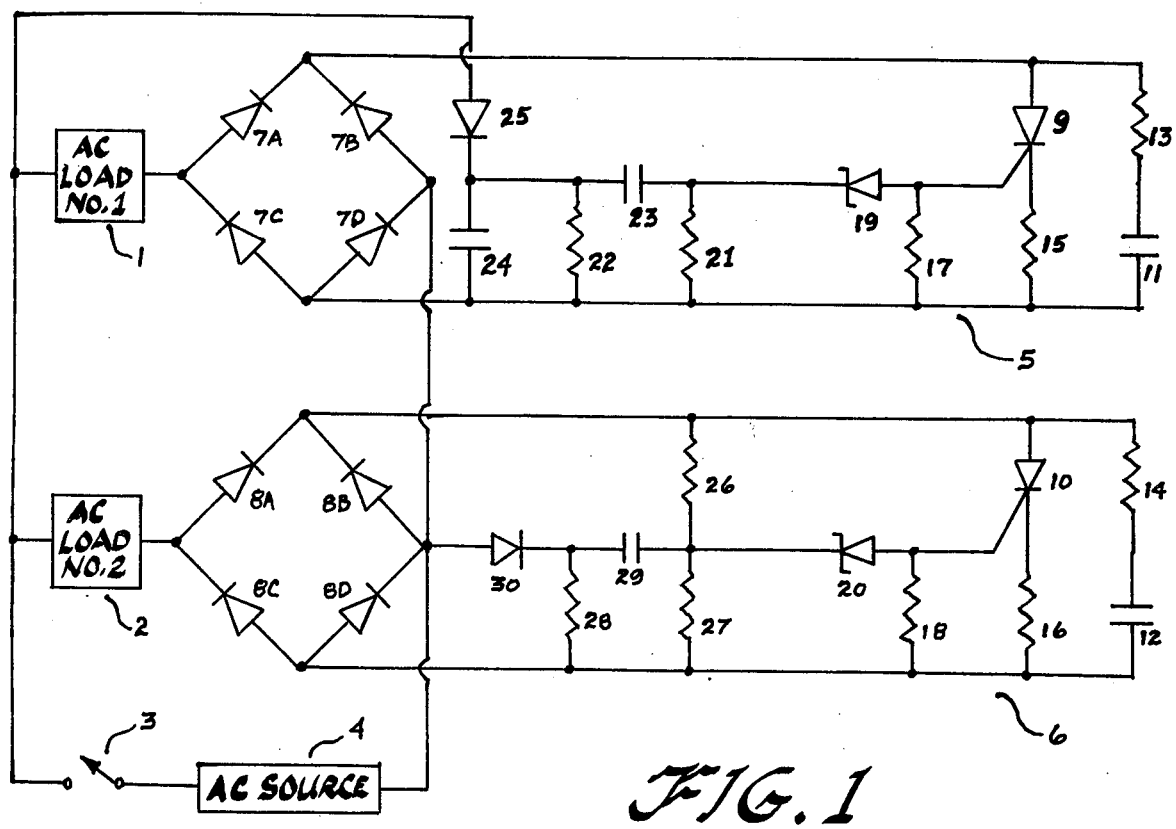
FIG. 1 shows an embodiment that allows selection of loads by varying the duration of power interruptions.

FIG. 1 illustrates an embodiment where AC loads 1 and 2 are individually controlled from a single manual switch 3 connected in the electrical transmission line between the loads and AC source 4. Switch 3 is illustrated as a means for momentary power interruption, although any other means of interrupting the primary current flow in the transmission line (including failure of the power source) can be used to activate the switching circuit. Current for load 1 is controlled by bistable thyristor switching circuit 5 and current for load 2 is controlled by bistable thyristor switching circuit 6. As will be seen in the following discussions, circuit 5 is configured so as to energize load 1 everytime power is applied following a rest period or a pause. Circuit 6 is configured so as to change conduction states after brief or paused interruptions of power and will energize load 2 on alternate switch closures, beginning with the second closure following a rest period. When circuits 5 and 6 are used together as shown in FIG. 1, the first application of power following a rest period will energize only load 1. A second application of power following a brief interruption will energize only load 2. If the second application of power had followed a pause, both loads 1 and 2 would have been energized. It can be seen, therefore, that any combination of the two loads can be selected by varying the lengths of power interruptions.

Circuits 5 and 6 are similar in operation except for their individual triggering schemes. SCR's 9 and 10, the main switching elements in both circuits, are made conductive by momentary application of gate drive through zener diodes 19 and 20. The full-wave bridges consisting of rectifiers 7A/7B/7C/7D and 8A/8B/8C/8D deliver rectified voltages to SCR's 9 and 10 so that load currents are always passing through the SCR's in the forward direction. Capacitors 11 and 12 store energy while the maximum voltage drop appears across the SCR's and then return energy during the two times during each AC cycle when the voltage drops to zero, thereby providing minimum holdup current requirements for the SCR's and maintaining conduction in the absence of gate drive. Resistors 13 and 14 are provided to limit the discharge current from capacitor 11 and 12 and prevent damage to SCR's 9 and 10. Resistors 15 and 16 have low resistance values and may be used to increase the voltage drop seen by capacitors 11 and 12, thereby allowing smaller capacitance values to store sufficient energy for the holdup current requirement. In some applications, forward biased diodes in the place of resistors 15 and 16 will provide the required additional voltage drop. Resistors 17 and 18 may also be needed in some applications to prevent internal gate current leakages in SCR's 9 and 10 from causing false turnons.

The trigger circuit for bistable thyristor switching circuit 5 consists of zener diode 19, resistors 21 and 22, capacitor 23 and diode 25. Capacitor 24 serves as the memory element for circuit 5. Since the reference voltage for zener diode 19 is selected to be less than AC source 4 voltage potential, gate drive for SCR 9 is provided on the first application of power following a rest period through diode 25, capacitor 23 and zener diode 19. While SCR 9 is on, however, capacitor 24 becomes charged to the voltage potential of AC source 4 through diode 25. If now a brief power interruption is caused by switch 3, capacitor 23 will not transfer any voltage to zener diode 19 when switch 3 is closed due to positive charge being maintained on its left side by capacitor 24. If, however, the described power interruption had been a pause which was long enough for resistor 22 to discharge capacitor 24, (and for resistor 21 to discharge capacitor 23, sufficient energy would have been transferred by capacitor 23 to turn on SCR 9. The desired operation of energizing load 1 only on applications of power following a rest period or a pause has thus been achieved.

The trigger portion of circuit 6 is comprised of zener diode 20, resistors 26, 27, and 28, capacitor 29 and diode 30. In this case, the trigger circuit must furnish a voltage greater than the voltage potential of AC source 4 to overcome the reference value of zener diode 20 (which is 160-200 volts) to deliver gate drive to SCR 10. On the first application of power, following a rest period, the line voltage is transferred through diode 30 and capacitor 29 to zener diode 20, but since the line voltage is less than the reference voltage of zener diode 20 no gate drive will be available to SCR 10. However, while power is applied, and SCR 10 is non-conductive, capacitor 12 (which also serves as the memory element) becomes charged to voltage potential of AC source 4. If, now, power to the circuit is interrupted by switch 3 resistors 26 and 27 will divide the voltage of capacitor 12 and apply the resulting voltage to the right side of capacitor 29. (Resistor 28 completes the charging path for capacitor 29 during this period.) If power is now restored to the circuit, by closure of switch 3, while capacitor 29 is thusly charged, the sum of the voltage across capacitor 29 and the voltage of AC source 4 (via diode 30) will be applied to zener diode 20. Since this sum of voltages will exceed the reference value of zener diode 20, gate drive will be momentarily applied to SCR 10, causing it to become conductive. Load 2 will thereby be energized, and the combined operation of circuits 5 and 6 will be as desired.

Figure 2:
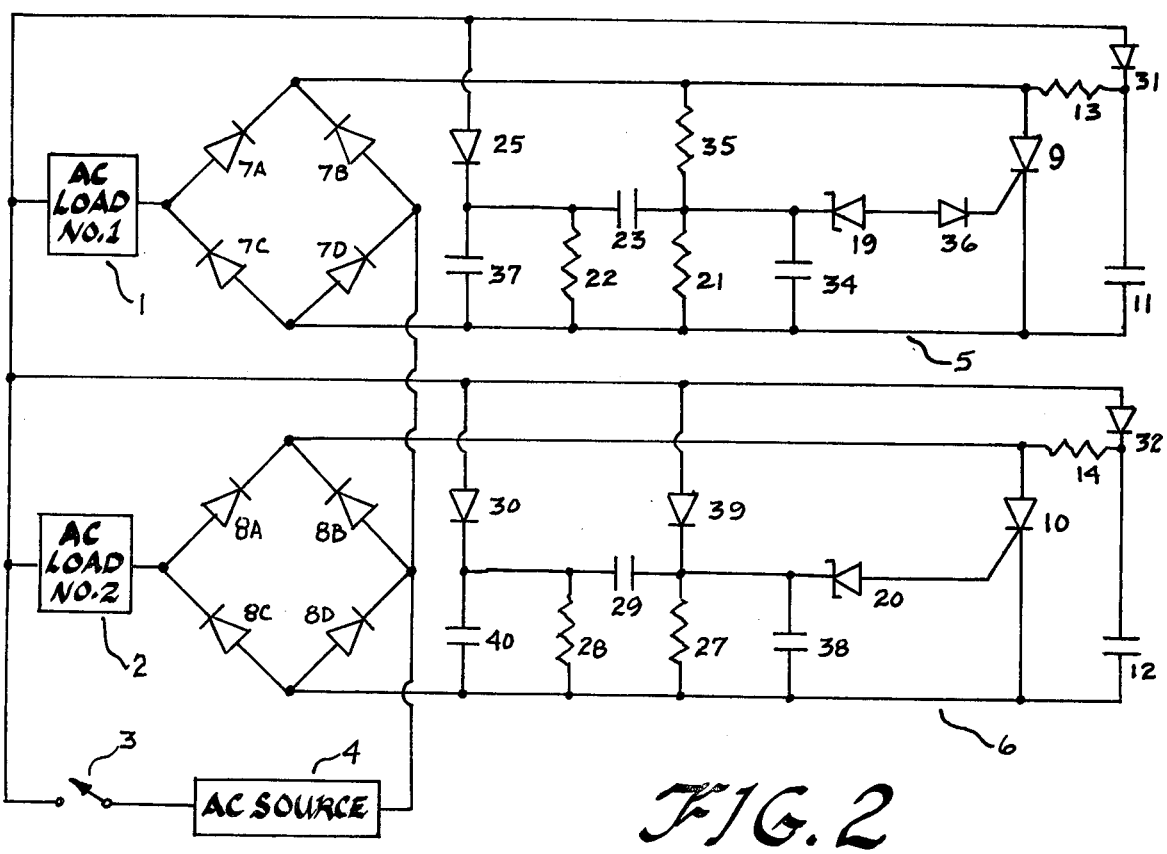
FIG. 2 shows an embodiment that energizes particular loads at particular points in a sequence of power interruptions.

FIG. 2 illustrates the use of two additional types of triggering circuits in controlling two AC loads, 1 and 2, in a different scenario. The first application of power from AC source 4 by switch 3 following a rest period will allow circuit 5 to energize AC load 1 only. A second application of power following a brief interruption will allow circuit 6 to energize AC load 2 only. A third application of power following another brief interruption will allow circuits 5 and 6 to energize both loads.

Operation of the full wave bridges made up from diodes 7A/7B/7C/7D in circuit 5 and diodes 8A/8B/8C/8D in circuit 6 is exactly as described for the FIG. 1 configuration. SCR's 9 and 10 likewise need no further discussion. The holdup circuits in FIG. 2 show the addition of diodes 31 and 32 as a means of supplying a higher voltage (and thus more energy) to capacitors 11 and 12. This arrangement provides sufficient holdup current to SCR's 9 and 10 with smaller capacitance values for capacitor for 11 and 12. Energy is supplied to SCR's 9 and 10, via resistors 13 and 14, during the two times per AC cycle that the voltage drops to zero.

The triggering means for circuit 5 consists of zener diode 19; capacitor 23; resistors 21, 22, and 35; and diodes 25 and 36. Capacitor 34 is the memory element for circuit 5. Diode 36 is only used to block leakage currents that might become critical in some applications. Capacitor 37 is added to filter the voltage from AC source 4 so that false turnons can be avoided as in some cases where a chopped waveform is present due to a motor speed control being the circuit. Zener diode 19 is selected for a voltage reference somewhat less than the voltage potential of AC source 4 so that the first application of power following a rest period will readily transfer voltage through diode 25, capacitor 23, zener diode 19 and diode 36 to the gate of SCR 9, thereby causing load 1 to be energized. A second application, following a brief interruption will find capacitor 23 still positively charged on the left side from the previous step because resistor 21 has a very high resistance and provides the only discharge path. This positive charge on capacitor 23 will prevent the transfer of sufficient voltage to overcome the reference value of zener diode 19. SCR 9 will, therefore, not become conductive on this second application of power. While switch 3 is closed, however, with SCR 9 not conducting, the voltage potential of AC source 4 is impressed across the divider network of resistors 35 and 21 and the resulting voltage is made available to capacitor 34, the memory element in circuit 5. If switch 3 is now opened briefly, capacitor 34 will charge capacitor 23 (through resistor 22) to its own potential. When switch 3 is now closed again, capacitor 23 will apply the sum of its charge and the voltage potential of AC source 4 (as supplied by diode 25) to zener diode 19. The resulting voltage sum will be greater than the reference value of zener diode 19 and AC load 1 will be energized on this third application of power, as desired. After a rest period circuit 5 will be ready to repeat the described cycle.

The triggering means in circuit 6 of FIG. 2 consists of zener diode 20; capacitor 29; resistor 27 and 28; and diodes 30 and 39. Capacitor 38 is the memory element for circuit 6. Capacitor 40 serves only to filter the voltage from AC source 4 for more reliable performance. The purpose of this triggering scheme is to allow AC load 2 to be energized after every brief interruption but never after a rest period. This is accomplished by selecting a voltage reference for zener diode 20 that is higher (160-200 volts) than the voltage potential of AC source 4. The first application of power, therefore, can not possibly exceed the reference value of zener diode 20 and AC load 2 will remain unenergized. While switch 3 is closed, however, diode 39 will quickly charge caacitor 38, the memory element in this circuit, to the potential of AC source 4. Now when the circuit is briefly opened by switch 3, capacitor 29 will be charged, through resistor 28, to the voltage of capacitor 38. When the switch is again closed, capacitor 29 will apply the sum of its charge and the voltage potential of the source (via diode 30) to zener diode 20. This voltage sum will exceed the reference value of zener diode 20, and AC load 2 will therefore be energized. Only during a rest period will resistor 27 be able to discharge capacitor 38 and avoid re-energization of AC load 2 with closure of Switch 3.

When used together as shown in FIG. 2, circuits 5 and 6 provide the desired operation to control AC loads 1 and 2 independently by a sequence of brief power interruptions. Circuit 5 energizes its load only on the first and third applications, circuit 6 energizes its load only on the second and third application, and after a suitable rest period the entire scenario may be repeated.

It should be noted that these circuits are equally suitable for controlling direct current loads connected to a common direct current source. The provisions for current rectification and SCR holdup would simply be eliminated (except where the holdup capacitor also serves as the memory element). It can easily be seen that other switches, manual or otherwise, may be added to the configurations presented in FIGS. 1 and 2 without changing the usefulness of the invention. In fact, one skilled in the art may easily devise other triggering means and other arrangements of loads by observing that which is taught by this invention.

I claim:

1. A bistable thyristor switching circuit for use with a system having an electrical power source and a means for power interruption coupled by an electrical transmission line to one or more remotely located loads, said switching circuit comprising:
    (a) semiconductor switching means having regenerative feedback, a pair of main terminals, and a gate terminal for producing a change in conductance between said main terminals in response to a control signal applied thereto;
    (b) means for coupling the main terminals of said semiconductor switching means in series between a respective load and said power source;
    (c) capacitor memory means for storing information representative of the most recent state of conduction of said semiconductor switching means; and
    (d) voltage regulator trigger means, coupled to said memory means and to said series coupling means, for generating a control signal for the gate terminal of said semiconductor switching means in response to a momentary interruption of the supply of power through said series coupling means, where said means for power interruption is remote from the bistable thyristor switching circuit.

2. The switching circuit of claim 1, where said means for power interruption is a manually operable power switch located at any point in said transmission line between said power source and said loads.

3. A bistable thyristor switching circuit according to claim 1, wherein said trigger means includes voltage regulator means coupled to said gate terminal of said semiconductor switching means and means, coupled to said memory means and said voltage regulator means, for momentarily applying to said voltage regulator means a voltage greater than a reference level of said voltage regulator means in response to the application of power to said bistable thyristor switching circuit following an interruption of power for a period of time longer than a prescribed period of time.

4. A bistable thyristor switching circuit according to claim 1, wherein said trigger means includes voltage regulator means coupled to said gate terminal of said semiconductor switching means and means, coupled to said memory means and said voltage regulator means and responsive to the operation of said means for power interruption, for momentarily applying to said voltage regulator means a voltage greater than a reference level of said voltage regulator means in response to the operation of said means for power interruption connecting said power source to said bistable thyristor switching circuit following an interruption of the connection of said power source to said bistable thyristor switching circuit via said means for power interruption for a period of time longer than a prescribed period of time.

5. A bistable thyristor switching circuit according to claim 3 or 4, wherein said momentarily applying means includes a diode-resistor-capacitor network coupled to said semiconductor switching means and said voltage regulator means.

6. A bistable thyristor switching circuit according to claim 1, wherein said trigger means includes voltage regulator means coupled to said gate terminal of said semiconductor switching means and means, coupled to said memory means and said voltage regulator means, for momentarily applying to said voltage regulator means a voltage greater than a reference level of said voltage regulator means in response to the application of power to said bistable thyristor switching circuit following a relatively brief interruption of power in response to the information stored in said memory means indicating that said semiconductor switching means was non-conductive immediately prior to said power interruption.

7. A bistable thyristor switching circuit according to claim 1, wherein said trigger means includes voltage regulator means coupled to said gate terminal of said semiconductor switching means and means, coupled to said memory means and said voltage regulator means and responsive to the operation of said means for power interruption, for momentarily applying to said voltage regulator means a voltage greater than a reference level of said voltage regulator means in response to the operation of said means for power interruption connecting said power source to said bistable thyristor switching circuit following a relatively brief interruption of the connection of said power source to said bistable thyristor switching circuit via said means for power interruption and in response to the information stored in said memory means indicating that said semiconductor switching means was non-conductive immediately prior to said interruption.

8. A bistable thyristor switching circuit according to claim 6 or 7, wherein said momentarily applying means includes a diode-resistor-capacitor network coupled to said semiconductor switching means and said voltage regulator means.

9. A bistable thyristor switching circuit according to claim 1, wherein said trigger means includes voltage regulator means coupled to said gate terminal of said semiconductor switching means and means, coupled to said memory means and said voltage regulator means, for momentarily applying to said voltage regulator means a voltage greater than a reference level of said voltage regulator means in response to the application of power to said bistable thyristor switching circuit following a relatively lengthy interruption of power or following a relatively brief interruption of power in response to the information stored in said memory means indicating that said semiconductor switching means was non-conductive immediately prior to said relatively brief interruption.

10. A bistable thyristor switching circuit according to claim 1, wherein said trigger means includes voltage regulator means coupled to said gate terminal of said semiconductor switching means and means, coupled to said memory means and said voltage regulator means and responsive to the operation of said means for power interruption, for momentarily applying to said voltage regulator means a voltage greater than a reference level of said voltage regulator means in response to the operation of said means for power interruption connecting said power source to said bistable thyristor switching circuit following a relatively lengthy interruption of the connection of said power source to said bistable thyristor switching circuit via said means for power interruption or following a relatively brief interruption of the connection of said power source to said bistable thyristor switching circuit via said means for power interruption and in response to the information stored in said memory memory means indicating that said semiconductor switching means was nonconductive immediately prior to said brief interruption.

11. A bistable thyristor switching circuit according to claim 1, wherein said trigger means includes voltage regulator means coupled to said gate terminal of said semiconductor switching means and means, coupled to said memory means and said voltage regulator means, for momentarily applying to said voltage regulator means a voltage greater than a reference level of said voltage regulator means in response to the application of power to said bistable thryistor switching circuit following an interruption of power for a relatively brief period of time.

12. A bistable thyristor switching circuit according to claim 1, wherein said trigger means includes voltage regulator means coupled to said gate terminal of said semiconductor switching means and means, coupled to said memory means and said voltage regulator means and responsive to the operation of said means for power interruption, for momentarily applying to said voltage regulator means a voltage greater than a reference level of said voltage regulator means in response to the operation of said means for power interruption connecting said power source to said bistable thyristor switching circuit following an interruption of the connection of said power source to said bistable thyristor switching circuit via said means for power interruption for a relatively brief period of time.

13. A bistable thyristor switching circuit according to claim 9, 10, 11, or 12, wherein said momentarily applying means includes a diode-resistor-capacitor network coupled to said semiconductor switching means and said voltage regulator means.

14. A bistable thyristor switching circuit according to claim 1, wherein said power source and said loads are alternating current types and said bistable thyristor switching circuit includes current rectification means in series with the main terminals of said semiconductor switching means, and holdup current means connected in parallel with the main terminals for said semiconductor switching means.

* * * * *